Figure 1:
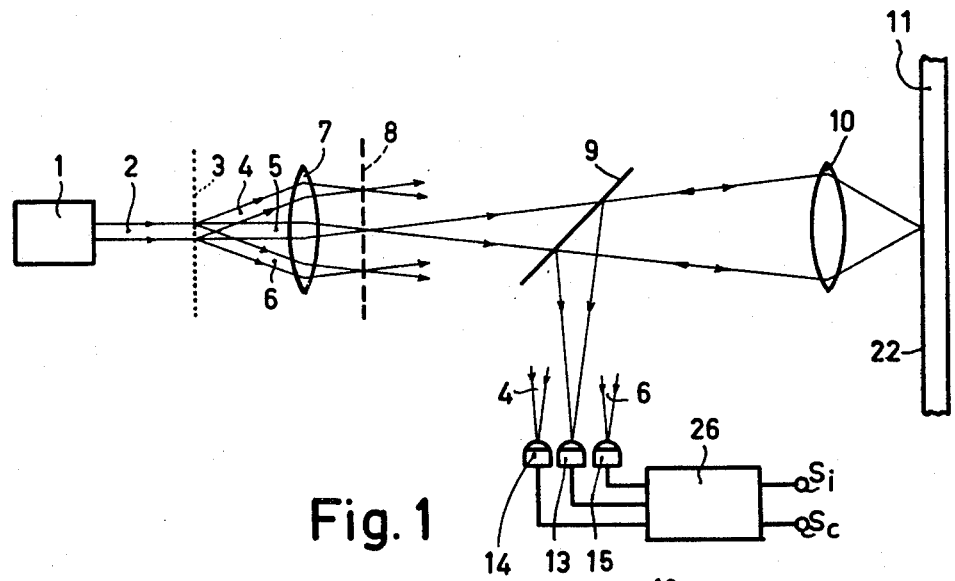

United States Patent [19]

Velzel et al.

[11] 4,074,314
[45] Feb. 14, 1978

[54] APPARATUS FOR OPTICALLY READING A RECORD CARRIER AND CORRECTING FOCUS ERROR

[75] Inventors: Christiaan Hendrik Frans Velzel; Peter Ferdinand Greve, both of Eindhoven, Netherlands

[73] Assignee: U.S. Philips Corporation, New York, N.Y.

[21] Appl. No.: 718,398

[22] Filed: Aug. 27, 1976

Related U.S. Application Data

[63] Continuation-in-part of Ser. No. 527,244, Nov. 26, 1974, Pat. No. 3,992,575.

[30] Foreign Application Priority Data

Feb. 25, 1974 Netherlands .................. 7402504

[51] Int. Cl.$^2$ .................. H04N 5/76; G11B 7/12
[52] U.S. Cl. .................. 358/128; 179/100.3 V; 350/194; 250/201
[58] Field of Search .................. 179/100.3 V; 358/128, 358/127, 130, 132, 227; 350/45, 194; 250/201, 570, 578; 354/200

[56] References Cited

U.S. PATENT DOCUMENTS

| | | | |
|---|---|---|---|
| 2,759,393 | 8/1956 | McLeod | 350/194 |
| 3,833,769 | 9/1974 | Compaan | 179/100.3 V |
| 3,876,841 | 4/1975 | Kramer | 179/100.3 V |
| 3,876,842 | 4/1975 | Bouwhuis | 358/128 |
| 3,969,575 | 7/1976 | Gerritsen | 179/100.3 V |
| 3,992,574 | 11/1976 | Bouwhuis | 179/100.3 V |
| 3,992,575 | 11/1976 | Velzel | 179/100.3 V |

*Primary Examiner*—Bernard Konick
*Assistant Examiner*—Alan Faber
*Attorney, Agent, or Firm*—Frank R. Trifari; Simon L. Cohen

[57] ABSTRACT

An apparatus is described for reading a record carrier on which information is stored in an optically readable reflecting structure. By projecting two radiation spots one before and one behind the plane of the information structure, it is possible to ascertain whether a read beam is properly focussed on the information structure. An optical wedge-field lens combination extends the range of operation of the focus correction device.

1 Claim, 10 Drawing Figures

APPARATUS FOR OPTICALLY READING A RECORD CARRIER AND CORRECTING FOCUS ERROR

This application is a continuation-in-part of U.S. Pat. Application Ser. No. 527,244, filed Nov. 26, 1974, now U.S. Pat. No. 3,992,575 issued Nov. 16, 1976.

The invention relates to an apparatus for reading a record carrier, on which information is stored in an optically readable structure. The apparatus includes a radiation source, an objective system for imaging the radiation source onto the information structure of the record carrier, a radiation-sensitive detection system for converting the radiation which is supplied by the radiation source and modulated by the information structure into an electrical signal. In order to determine a possible deviation between the desired and the actual position of the plane of the information structure, the radiation source consists of at least two radiation sub-sources which are offset relative to each other both in the direction of the optical axis of the objective system and in a direction transverse thereto, a separate detector being provided in the detection system for each of the radiation sub-sources.

In a known apparatus, apart from a read spot which serves for reading the high-frequency information on the record carrier, two auxiliary radiation spots are projected onto the information structure. Each of the sub-beams, with which the auxiliary radiation spots are formed, is focussed in a different plane. The planes are situated at either side of the plane in which the read spot is focussed. The mutual distances between the different planes are constant.

The read beam which is modulated by the information structure and the sub-beams are led to separate detectors in the radiation-sensitive detection system. The modulation depths of the electrical signals supplied by the detectors depend on the degree of focussing of the corresponding beams on the information structure. By comparison of the signals supplied by the auxiliary detectors associated with the auxiliary radiation spots, it is possible to ascertain whether the read beam is focussed on the information structure and in which direction a deviation, if any, occurs.

In the known apparatus the read beam and the sub-beams were derived from a main beam, supplied by the radiation source, with the aid of a Fresnel zone plate. The present invention provides an apparatus in which the various beams are formed in a different manner. According to a general feature of the apparatus according to the invention the radiation path between the radiation source and the objective system successively includes: a first element, which divides a radiation beam supplied by the radiation source into separate sub-beams, and a second element for focussing the sub-beams in different planes.

A first embodiment of an apparatus according to the invention is further characterized in that the first element is a diffraction grating and that the second element is a radiation-transmitting plate, disposed in the object plane of the objective system, which plate has a number of different thicknesses which correspond to the number of sub-beams.

According to a feature of a second embodiment of an apparatus according to the invention, the first element consists of a Wollaston prism and the second element is a lens of a doubly-refracting material.

The invention will now be described with reference to the drawing, in which

Figure 2:
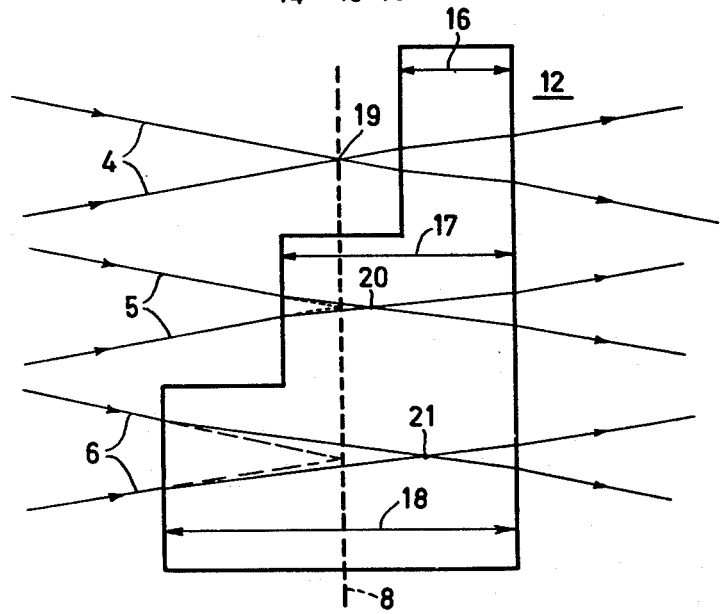
Figure 3:
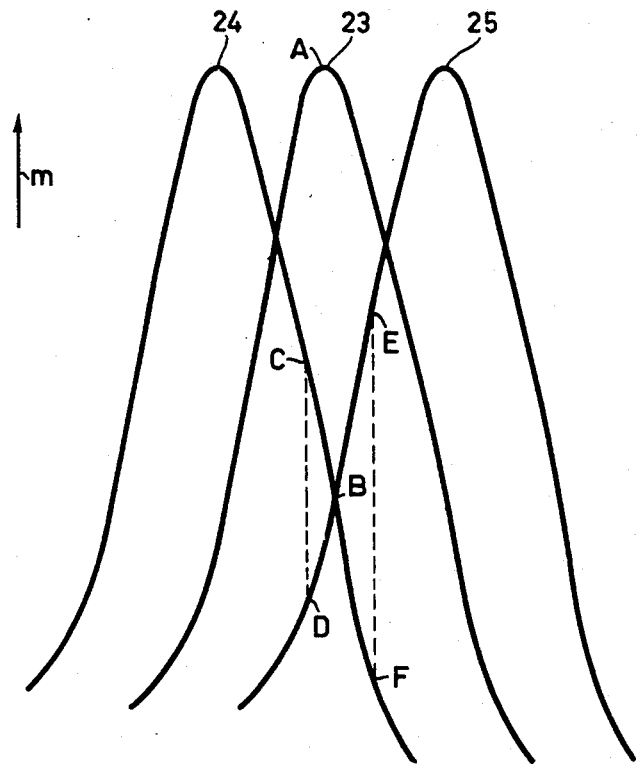
Figure 4:
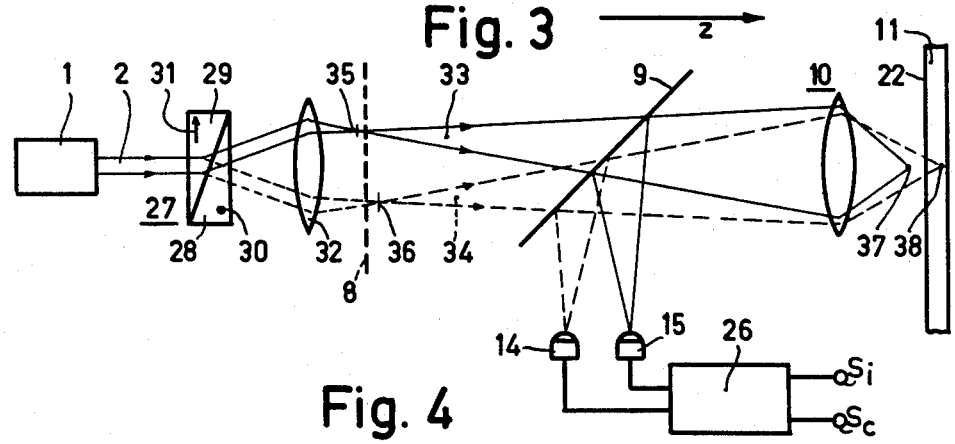
Figure 5:
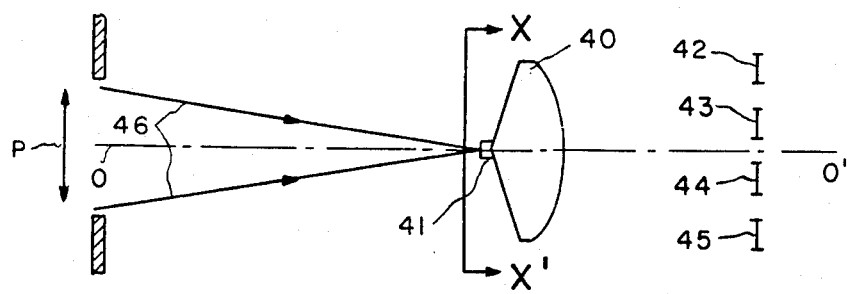
Figure 6A:
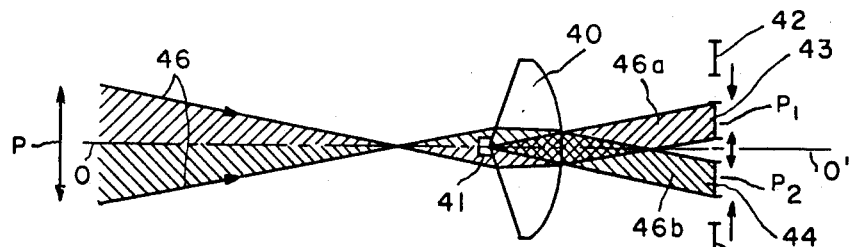
Figure 6B:
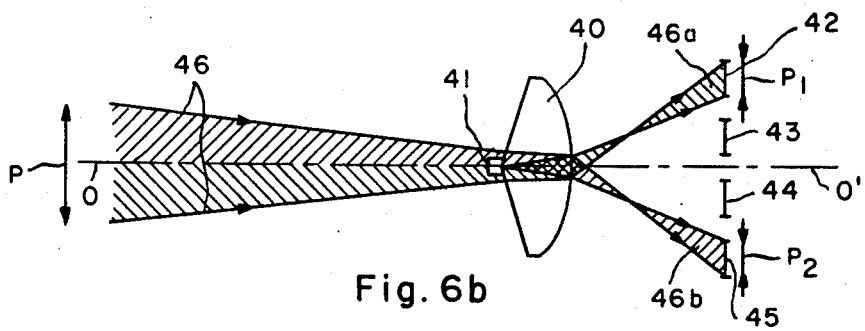
Figure 7:
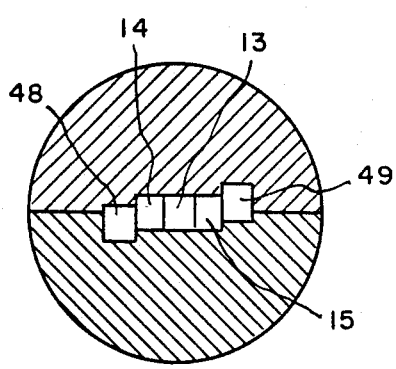
Figure 8:
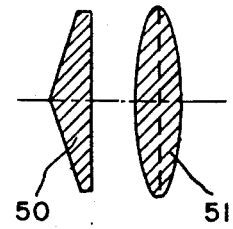
Figure 9:
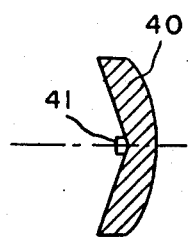

FIG. 1 schematically shows a first embodiment of an apparatus according to the invention, FIG. 2 shows an element of said apparatus, FIG. 3 shows the variation of the modulation of the signals, supplied by the detectors in the apparatus of FIG. 1, as a function of the focussing, FIG. 4 schematically shows a second embodiment of an apparatus according to the invention, FIG. 5 shows a part of a third embodiment of an apparatus, FIGS. 6a and 6b illustrate the operation of this embodiment, and FIGS. 7, 8 and 9 show elements for use in the apparatus of FIG. 5.

In FIG. 1 the reference numeral 1 represents a radiation source, for example a laser source, which supplies a narrow beam of radiation 2. The beam is incident on a diffraction grating 3, so that two first-order beams 4 and 6 and one zero-order beam 5 are obtained. The sub-beams 4, 5 and 6 are focussed in a plane 8 by an auxiliary lens 7. The plane is the object plane of an objective system 10, which focusses the read beam 5 on the information structure to be read. By way of example, it is assumed that the plane 22 of the information structure is located at the front side of the record carrier 11. Furthermore, it is assumed by way of example that the information structure is reflecting, so that the modulated read beam returns substantially along itself. For example, the modulated read beam is reflected to a radiation-sensitive detector 13 using a semi-transparent mirror 9. The stored information may be recovered from the electrical output signal of the detector 13 in the electronic circuit 26, in a known manner (signal Si).

In the plane 8, according to the invention, a radiation-transmitting element, for example a glass or a plastic plate 12 is disposed, of which a cross-section is shown in FIG. 2. The plate is stepped and has three different thicknesses 16, 17 and 18, the differences in thickness 18–17, and 17–16 being equal. Owing to the presence of the plate 12 in the apparatus of FIG. 1, the beams 4, 5 and 6 must traverse different optical pathlengths. The foci 19, 20 and 21 of the beams are then no longer disposed in the plane 8, but are axially shifted. The focus 20 is imaged in the plane 22 by the objective 10, while the foci 19 and 20 are imaged in front of and behind the plane 22 respectively.

The sub-beams 4 and 6 are guided to their associated detectors 14 and 15 in a similar way as the read beam 5. The output signals of the detectors are also modulated in accordance with the information stored on the record carrier. In the position of the plane 22 relative to the objective shown in FIG. 1, the beam 5 forms a read spot on the information structure whose size is of the order of magnitude of the smallest optical detail in the information structure. The modulation depth of the signal supplied by the detector 13 is then maximum. The sub-beams 4 and 6 are not sharply focussed on the information structure, so that the radiation spots formed on the information structure by these beams are larger than the read spot. The modulation depths of the signals supplied by the detectors 14 and 15 are consequently smaller than that of the signal supplied by the detector 13.

FIG. 3 shows the variation of the modulation depth $m$ as a function of the defocussing $z$. The curves 23, 24 and 25 correspond to the detectors 13, 14 and 15 respectively. If the read beam 5 is focussed on the information structure, i.e. if $z = 0$, the curve 23 attains its maximum A. The curves 24 and 25 both pass through point B: the modulation depths of the signals supplied by the detectors 14 and 15 are equal. If the plane 22 is located to the left of the desired position, i.e. $z$ is smaller than zero, the modulation depth C of the signal from the detector 14 is greater than the modulation depth D of the signal from the detector 15. If the plane 22 is located to the right of the desired position, i.e. $z$ is greater than zero, the situation is reversed, compare points E and F in FIG. 3. From the difference in modulation depth of the signals supplied by the detectors 14 and 15 it is possible to derive a substantially linear control signal $S_c$ in an electronic circuit 26 which is connected to the detectors. By means of said control signal the focussing of the objective 10 can be corrected as regards direction and magnitude, in known manner.

In an embodiment of an apparatus according to FIG. 1, the objective had a numerical aperture of 0.4. The foci of the sub-beams 4 and 6 were located 4 μm before and behind the focus of the read beam. At a spatial frequency of 400/mm of the optical details in the information structure focussing errors between + 12 μm and − 12 μm could be detected satisfactorily. The linear region ranged between + 2 μm and − 2 μm.

It is to be noted that when using the described method of reading a record carrier, in which the spatial frequency of the optical details which represent the information varies over the record carrier, the magnitude of the signal for focussing correction changes with the location of the record carrier. This occurs for example in the case of a round disc-shaped record carrier on which a television program is stored in a multiplicity of concentric or quasi-concentric tracks, each track containing a TV frame. The average spatial frequency of the optical details is a function of the radius of the relevant track. When reading such a record carrier, even when the focussing remains the same, the modulation depths of the electrical signals supplied by the detectors will change. According to the invention, use can be made of the so-called line synchronizing pulses in the television signal for determining the deviations between the actual and the desired position of the plane of the information structure. These pulses for example have a frequency of 4 MHz, which corresponds to a spatial frequency on the record carrier varying between for example 180 and 360 periods per mm for track radii between for example 17 and 14 cm. In this range of spatial frequencies the variation in modulation depth is relatively small, for example 15%, so that in said range the influence of the variation of the spatial frequencies on the signal for focussing correction is small.

FIG. 4 shows a second embodiment of an apparatus according to the invention. In the apparatus a Wollaston prism 27 is disposed behind the radiation source 1. This prism consists of two identically equal component prisms 28 and 29 of uniaxial doubly refracting crystals. The optic axis 31 of the component prism 29 is parallel to the plane of drawing and the optic axis 30 of the component prism 28 is perpendicular to the plane of drawing. The radiation beam 2 which is incident on one of the parallel major faces of the Wollaston prism 27 is split into two sub-beams 33 and 34 in the prism, which are polarized mutually perpendicularly and which make a small angle with each other. The sub-beams traverse a lens 32 of a doubly-refracting material. The axis of the lens 32 is a diagonal relative to the directions of polarization of the sub-beams. As a result, said lens has different powers for different directions of polarization, so that the sub-beams 33 and 34 are focussed in planes which are located at different distances from the lens 32. The foci 35 and 36 are imaged in different planes near the plane 22 of the information structure by the objective 10. Instead of a lens of a doubly-refracting material it is also possible to use a normal lens, a glass plate 12 then again being disposed in the plane 8. The Wollaston prism may be replaced by a Savart plate.

If the plane 22 is in the correct position, as is shown in FIG. 4, the image 37 of the focus 35 is located before and the image 38 of the focus 36 behind the plane 22. The sub-beams 33 and 34 are reflected and modulated by the information structure and are directed to the detectors 14 and 15 by, for example, a semi-transparent mirror 9.

In this case no separate read beam is employed; the high-frequency information is derived from the signals supplied by the detectors 14 and 15 associated with the auxiliary radiation spots. In an electronic circuit 26 which is connected to said detectors, a high frequency component $S_i$, for recovering the information stored on the record carrier, and a component $S_c$ which provides an indication of the focussing, can be extracted.

For a correct reading it is necessary that the signals from the detectors 14 and 15 have sufficient modulation depth. The distances between the foci of the radiation beams 33 and 34 and the plane 22 of the information structure should not become too large. The range in which focussing errors can be detected is therefore smaller for the apparatus of FIG. 4 than for the apparatus of FIG. 1.

Also for an apparatus in accordance with FIG. 1 the range in which the deviations between the actual and the desired position of the plane of the information structure can be detected is limited. By a suitable choice of the size of the detectors, however, said range may be extended. A low-frequency component of the detector signals is then measured. The component exhibits a substantial variation for such deviation between the actual and the desired position of the plane of the information structure that the diameter of the sub-beams at the location of the detectors is smaller than the radiation-sensitive are of the detectors. In the electronic circuit 26 the low-frequency components of the detector signals produced by the sub-beams, may be compared and processed to a control signal for focussing correction. Thus, deviations between the actual and desired position of the plane of the information structure up to for example ±30 μm can be determined.

With this last method the individual details of an information track are no longer observed, but averaging over a certain track of length is applied. For this, use is made of the fact that on an average a track has a different influence on a radiation beam than the area between the tracks. This method may therefore be used for detecting deviations between the actual and desired position of a record carrier with blank tracks. A blank track is to be understood to mean a track which contains no information details, but which can be optically distinguished from the areas surrounding it. The method may for example be used for writing on an informationless record carrier body which is provided with follow-on tracks for positioning the write spot of radiation onto the record carrier body.

For determining deviations of the position of the information plane the apparatus either employs the information structure in the tracks or the track structure. The apparatus is not only suited for reading a radiation-reflecting record carrier, as is represented in FIGS. 1 and 4, but also for reading a record carrier which is radiation-transmitting.

The range in which the deviation in the position of the information plane can be determined may be extended still further, according to the invention, by employing a wedge-shaped element and a number of additional radiation-sensitive detectors, as shown in FIG. 5. The extension may be employed only for reading a radiation-reflecting record carrier. The plane of the information structure is then namely used as a radiation-reflecting plane which forms part of an imaging system which images the radiation source onto a detector system. A displacement of the plane will give rise to a displacement of the image over the detection system and to a variation of the signals supplied by the individual detectors.

FIG. 5 only shows a part of the path traversed by the radiation upon reflection at the record carrier. The exit pupil of the objective 10 (see FIGS. 1 and 4) is designated by p. The sub-beams 4, 5 and 6 of FIG. 1 or the sub-beams 33 and 34 of FIG. 4 may be assumed to form one beam in the apparatus to be described hereinafter. The element 40 in FIG. 5 on the one hand functions as a field lens which forms an image of the exit pupil in the plane in which the four detectors 42, 43, 44 and 45 are disposed. On the other hand, the element 40 is an optical wedge which splits the beam 46 into two sub-beams (46a and 46b in FIGS. 6a and 6b). As a result, two images of the exit pupil (P1 and P2 in FIGS. 6a and 6b) are formed, viz. one image for the detectors 42 and 43 and one image for the detectors 44 and 45.

If the deviation between the actual position and the desired position of the plane of the information structure is smaller than a specific value, the beam 46 which is reflected by the information surface is concentrated in a small area at the edge of the wedge 40 (see FIG. 5). At the edge a row 41 of radiation-sensitive detectors is disposed. In FIG. 5 the row extends in a direction perpendicular to the plane of the drawing. In FIG. 7 a front view (cross-section taken on the line X — X' in FIG. 5) of the wedge with the row of detectors is shown. The row 41 for example comprises a central detector 13 with the same function as the detector 13 in FIG. 1, and two detectors 14 and 15 also having the same function as detectors 14 and 15 in FIG. 1. Moreover, two further detectors 48 and 49 may be provided. The detectors are employed for detecting deviations in the centering of the central read spot of radiation relative to a track to be read in a manner as described in U.S. Pat. application Ser. No. 345,644, filed Mar. 28, 1973, now U.S. Pat. No. 3,876,842, issued Apr. 8, 1975. The detectors 48 and 49 cooperate with two additional sub-beams, which sub-beams form two additional radiation spots onto the information structure which are offset relative to the central radiation spot in the longitudinal direction of a track and in a direction transverse thereto.

In the case of small deviations from the position of the plane of the information structure the radiation which is reflected by the information structure is completely intercepted by the detectors 13, 14, 15, 48 and 49 and no radiation will reach the detectors 42, 43, 44 and 45. In the event of larger deviations in the position of the plane of the information structure, the image of the radiation source which is formed through reflection at the record carrier will be produced at some distance from the refracting edge of the wedge. FIG. 6a shows the situation in which the distance between the objective 10 and the radiation-reflecting surface 22 (compares FIGS. 1 and 4) is too great. The radiation beam 46 for a substantial part falls outside the row 41 of detectors on the element 40. Upon passage through said element two sub-beams 46a and 46b are formed, one of which (sub-beam 46a) is incident on the detector 43 and the other (sub-beam 46b) on the detector 44. If the distance between the objective 10 and the radiation reflecting surface 22 is too small, the sub-beam 46a will be incident on the detector 42, while the sub-beam 46b will impinge on the detector 45, as is shown in FIG. 6b.

The position of the radiation-reflecting plane 22 relative to the objective 10 determines the position of the image P1 and P2 respectively of the exit pupil p of the objective relative to the detectors 42, 43 and 44, 45 respectively. If the signals supplied by the detectors 42, 43, 44 and 45 are represented by S42, S43, S44 and S45 respectively, the magnitude and the direction of a deviation in the position of the plane of the information structure can be derived from the signal:

$$S1 = (S42 - S43) + (S45 - S44).$$

It is also possible to determine the position of the refracting edge of the element 40 relative to the optical axis 00' of the objective 100. When the element 40 is correctly centered relative to the optical axis, the sum of the radiation intensities on the detectors 42 and 43 equals that of the radiation intensities on the detectors 44 and 45. The magnitude and the direction of the centering error may be derived from the signal:

$$S2 = (S42 + \text{signal } S43) - (S44 + S45).$$

Alternatively, instead of four detectors 42, 43, 44 and 45, only three detectors might be used. For example, the detectors 44 and 45 might be replaced by a single detector 44'. The magnitude and the direction of an error in the position of the information carrying plane is then given by:

$$S1' = S42 - S43,$$

and the magnitude and direction of the centering error of the element 10 by:

$$S2' = (S42 + 43) - S44'.$$

However, the arrangement with three detectors is less accurate than that using four detectors.

The element 40 in FIG. 5 may also be replaced by a separate wedge 50 and a field lens 51 disposed behind it, as is shown in FIG. 8. The element 40 may also have a shape as shown in FIG. 9.

The location and the mutual distance of the detector 42, 43, 44 and 45 is determined by the shape and the apex angle of the wedge-shaped element 40 (or element 50 in FIG. 8).

The row 41 of detectors may also be disposed at some distance from the element 40 (or element 50). The arrangement of FIG. 5 is of the simplest construction.

The maximum deviations between the desired and the actual position of the plane of the information, which can be detected with the aid of the apparatus according to FIG. 5, are determined by the dimensions of the wedge (40 or 50). With an embodiment of an apparatus according to FIG. 5 in which the wedge was $8 \times 8$ mm$^2$ deviations between approximtely $-500 \mu$ to $-10$ μ and between approximately + 30 μ to + 700 μ could be detected.

In an apparatus for reading a record carrier as shown in FIGS. 1 and 4, a movable mirror may be disposed in the radiation path for moving the central read spot relative to the tracks. If the mirror is not disposed in the entrance pupil of the objective, its movement will give rise to small displacements of the images $P_1$ and $P_2$ of the exit pupil P. The influence of the mirror movement on the signal for focussing correction can be minimized by disposing the detectors 42 and 43 as well as the detectors 44 and 45 at some distance from each other. Thus, it is avoided that a wrong detector is illuminated owing to a mirror movement.

The elements 40, 42, 43, 44 and 45 may also be incorporated in the apparatus of FIG. 4. However, the central detector 31 is then not included in the row 41 of detectors.

What we claim is:

1. An apparatus for reading a record carrier on which information is stored in an optically readable structure, which apparatus includes a radiation source, an objective system for imaging the radiation source on the information structure of the record carrier, a radiation-sensitive detection sstem for converting the radiation which is supplied by the radiation source and modulated by the information structure into an electrical signal, said apparatus being provided with a focus error detection system, wherein the radiation source comprises at least two radiation sub-sources, which are offset relative to each other both in the direction of the optical axis of the objective system and in a direction transverse thereto, a separate detector in the detection system for each of the radiation sub-sources, a first element means for dividing a radiation beam supplied by the radiation source into two separate sub-beams, a second element means for focussing the sub-beams in different planes, an optical assembly comprising an optical wedge and a field lens disposed in the path of the radiation passing said separate detectors, and at least three additional radiation-sensitive detectors disposed in the plane in which images of the exit pupil of the objective system are formed by the optical assembly, wherein the radiation - sensitive detection system detects small errors in focusing and the additional radiation - sensitive detectors derive correction signals for large focusing errors.

* * * * *

UNITED STATES PATENT AND TRADEMARK OFFICE
CERTIFICATE OF CORRECTION

PATENT NO. : 4074314
DATED : February 14, 1978
INVENTOR(S) : CHRISTIAAN HENDRIK FRANS VELZEL ET AL It is certified that error appears in the above-identified patent and that said Letters Patent are hereby corrected as shown below:

Column 6, line 2, "compares" should be --compare--

Column 6, line 27, "100" should be --10--

Column 7, line 17, "31" should be --13--

IN THE CLAIMS

Claim 1, line 6, "sstem" should be --system--

Signed and Sealed this

Twentieth Day of June 1978

[SEAL]

Attest:

RUTH C. MASON
Attesting Officer

DONALD W. BANNER
Commissioner of Patents and Trademarks